United States Patent
Anthis et al.

(10) Patent No.: US 11,396,698 B2
(45) Date of Patent: Jul. 26, 2022

(54) ALD PROCESS FOR NIO FILM WITH TUNABLE CARBON CONTENT

(71) Applicant: Applied Materials, Inc., Santa Clara, CA (US)

(72) Inventors: Jeffrey W. Anthis, San Jose, CA (US); Ghazal Saheli, Campbell, CA (US); Feng Q. Liu, San Jose, CA (US); David Thompson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 575 days.

(21) Appl. No.: 15/863,348

(22) Filed: Jan. 5, 2018

(65) Prior Publication Data

US 2018/0195170 A1    Jul. 12, 2018

Related U.S. Application Data

(60) Provisional application No. 62/443,691, filed on Jan. 7, 2017, provisional application No. 62/555,133, filed on Sep. 7, 2017.

(51) Int. Cl.
*C23C 16/40* (2006.01)
*C23C 16/455* (2006.01)

(52) U.S. Cl.
CPC ........ *C23C 16/40* (2013.01); *C23C 16/45527* (2013.01); *C23C 16/45531* (2013.01); *C23C 16/45553* (2013.01)

(58) Field of Classification Search
CPC .............. C23C 16/40; C23C 16/45527; C23C 16/45531; C23C 16/45553
See application file for complete search history.

(56) References Cited

U.S. PATENT DOCUMENTS

| | | | |
|---|---|---|---|
| 2010/0270626 A1* | 10/2010 | Raisanen | H01L 21/28194 257/410 |
| 2011/0001110 A1* | 1/2011 | Takahashi | H01L 45/1675 257/2 |
| 2011/0284079 A1* | 11/2011 | Pierreux | H01L 21/0228 136/261 |
| 2014/0120737 A1* | 5/2014 | Swaminathan | H01L 21/02274 438/765 |
| 2014/0175355 A1* | 6/2014 | Wang | H01L 45/08 257/2 |
| 2014/0175367 A1* | 6/2014 | Tendulkar | H01L 27/2481 257/4 |
| 2014/0242298 A1* | 8/2014 | Lansalot-Matras | C23C 16/18 427/576 |
| 2015/0072508 A1 | 3/2015 | Or et al. | |
| 2015/0228663 A1* | 8/2015 | Youn | H01L 27/11582 438/268 |

OTHER PUBLICATIONS

Pan et al, Atomic Layer Deposition Process Modeling and Experimental Investigation for Sustainable Manufacturing of Nano Thin Films, Oct. 2016, Journal of Manufacturing Science and Engineering, vol. 138.*
Appendix H standard reduction potentials*—California State University, Northridge. (n.d.). Retrieved Apr. 18, 2022, from https://www.csun.edu/~hcchm003/321/Ered.pdf.

* cited by examiner

*Primary Examiner* — Bethany L Martin
(74) *Attorney, Agent, or Firm* — Servilla Whitney LLC

(57) ABSTRACT

Processing methods comprising exposing a substrate to a first reactive gas comprising a cyclopentadienyl nickel complex and a second reactive gas comprising a sub-saturative amount of oxygen to form a nickel oxide film with a carbon content in the range of about 2 to about 10 atomic percent are described.

18 Claims, No Drawings

ALD PROCESS FOR NIO FILM WITH TUNABLE CARBON CONTENT

CROSS-REFERENCE TO RELATED APPLICATIONS

This application claims priority to U.S. Provisional Application No. 62/555,133, filed Sep. 7, 2017 and U.S. Provisional Application No. 62/443,691, filed Jan. 7, 2017, the entire disclosures of which are hereby incorporated by reference herein.

FIELD

Embodiments of the disclosure relate to nickel thin film deposition. More particularly, embodiments of the disclosure are directed to the deposition of nickel oxide thin films with tunable carbon content.

BACKGROUND

Since Ni oxide thin film importance as electrochromic material in electronic devices, its process of thin film oxide has been studied by many academic publications. Many precursors have been used for Ni oxide synthesis, including dicyclopentadienylnickel, Nickel diketonate, and their derivatives. The oxidizing agents include $O_2$, $O_3$, $H_2O_2$, etc.

Ni oxide thin film with some carbon content in the film function as ReRAM materials has been studied many years. Nickel oxide films are currently synthesized using a sol-gel method.

Therefore, there is a need in the art for methods of depositing nickel oxide thin films with tunable carbon content.

SUMMARY

One or more embodiments of the disclosure are directed to processing methods comprising exposing a substrate to a first reactive gas comprising a cyclopentadienyl nickel complex and a second reactive gas comprising a sub-saturative amount of oxygen to form a nickel oxide film with a carbon content in the range of about 2 to about 10 atomic percent.

Additional embodiments of the disclosure are directed to processing methods comprising sequentially exposing a substrate to a pulse of a first reactive gas comprising bis(ethylcyclopentadienyl)nickel and a sub-saturative pulse of a second reactive gas consisting essentially of $O_2$ to form a nickel oxide film with a carbon content in the range of about 2 atomic percent to about 10 atomic percent.

Further embodiments of the disclosure are directed to processing methods comprising sequentially and repeatedly exposing a substrate to a pulse of a first reactive gas comprising dicyclopentadienylnickel and a sub-saturative pulse of a second reactive gas consisting essentially of $O_2$ to form a nickel oxide film with a carbon content in the range of about 2 atomic percent to about 10 atomic percent.

DETAILED DESCRIPTION

Embodiments of the disclosure provide precursors and processes for depositing nickel-containing films. The process of various embodiments uses vapor deposition techniques, such as an atomic layer deposition (ALD) or chemical vapor deposition (CVD) to provide nickel films.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the disclosure provide a manufacture-capable ALD process using bis(ethylcyclopentadienyl) nickel and/or dicyclopentadienylnickel with oxygen. Some embodiments advantageously provide methods to deposit nickel oxide films with controllable carbon content.

In some embodiments, bis(ethylcyclopentadienyl)nickel is used as precursor to react with oxygen at controlled temperature and oxygen flow rate sequentially to achieve Ni oxide thin film with a controlled carbon content.

Accordingly, one or more embodiments of the disclosure are directed to processing methods to deposit a nickel oxide film with a carbon content greater than 0% on an atomic basis. The processing method comprises exposing a substrate or substrate surface to a first reactive gas and a second reactive gas in either a chemical vapor deposition process where the reactive gases are mixed or in an atomic layer deposition process where the reactive gases are exposed separately to the substrate. In some embodiments, the substrate or substrate surface comprises one or more of platinum, iridium or ruthenium.

The first reactive gas comprises a nickel complex. The nickel complex of some embodiments comprises a cyclopentadienyl nickel complex. As used in this manner, a "cyclopentadienyl nickel complex" is a nickel containing organometallic species having a cyclopentadienyl (Cp) ligand. The Cp ligand can be substituted or unsubstituted. In some embodiments, the Cp ligand has a methyl group, an ethyl group, a propyl group, or a C1-C6 alkyl group. In some embodiments, the Cp ligand has more than one substituent group. For example, the Cp ligand may have in the range of 0 to 5 substituent groups with each group comprising H or a C1-C6 alkyl group. The nickel complex may also contain other ligands. For example, some embodiments include a neutral donor ligand like a carbonyl group. There can be any suitable number of carbonyl groups depending on, for example, the oxidation state of the nickel and the number of Cp groups. In some embodiments, the cyclopentadienyl nickel complex comprises in the range of about 0 to about 3 carbonyl groups.

Suitable examples of cyclopentadienyl nickel complexes include, but are not limited to, bis(ethylcyclopentadienyl) nickel, an ethylcyclopentadienyl nickel carbonyl complex or dicyclopentadienylnickel. In some embodiments, the first reactive gas consists essentially of bis(ethylcyclopentadienyl)nickel. As used in this manner, the term "consists essentially of" means the nickel-containing precursor is greater than or equal to about 95%, 98% or 99% of the stated species on a molecular basis. In some embodiments, the cyclopentadienyl nickel complex comprises one or more carbonyl ligands. In some embodiments, the cyclopentadienyl nickel complex comprises or consists essentially of ethylcyclopentadienyl nickel carbonyl. In some embodiments, the ethylcyclopentadienyl nickel complex comprises or consists essentially of ethylcyclopentadienyl nickel dicarbonyl.

In some embodiments, the nickel film is formed by a CVD process where the first reactive gas and the second reactive gas are exposed to the substrate at the same time in a mixture. In some embodiments, the nickel film is formed by an ALD process where the first reactive gas and the second reactive gas are exposed to the substrate sequentially.

The second reactive gas of some embodiments comprises molecular oxygen (i.e., $O_2$). In some embodiments, the second reactive gas consists essentially of oxygen. As used in this regard the term "consists essentially of oxygen" means that the reactive species of the second reactive gas is greater than or equal to about 95%, 98% or 99% oxygen on a molecular basis. Diluent and inert gases are not included in the reactive gas calculation for either the first reactive gas or the second reactive gas.

In some embodiments, the second reactive gas comprises a sub-saturative amount of oxygen to form a nickel oxide film with a carbon content. As used herein, the term "sub-saturative amount" means that the oxygen available for reactive with the substrate surface, a chemisorbed nickel complex on the substrate surface or the nickel complex in the gas phase, is less than or equal to about 1:1 relative to the available nickel atoms. The inventors have found that a saturative amount of oxygen forms a film without a suitable or sufficient carbon content. In some embodiments, the available O:N ratio is less than 1, 0.95, 0.9, 0.85, 0.8, 0.75, 0.7, 0.65, 0.6, 0.55 or 0.5. In some embodiments, the second reactive gas includes one or more of water vapor, molecular oxygen or ozone.

In some embodiments, the second reactive gas comprises a mixture of ozone and oxygen. The mixture of some embodiments is in the range of about 5% to about 25% by weight, or in the range of about 10% to about 20% by weight, or in the range of about 15% to about 20% by weight. In some embodiments, the second reactive gas comprises a mixture of ozone and oxygen in which the $O_3/O_2$ ratio is greater than or equal to about 0.05, 0.1, 0.15 or 0.18. The second reactive gas may include inert or diluent gases which are not included in the ratio and percentage calculations.

In some embodiments, the second reactive gas comprises a remote plasma of $O_2$ or a mixture of $O_3$ and $O_2$. The remote plasma is generated away from the surface of the substrate and flows to the surface for reaction. The remote plasma is generated without using the substrate as an electrode.

The carbon content of the nickel oxide film of some embodiments is greater than 1%. In some embodiments, the nickel oxide film has a carbon content in the range of about 1% to about 15%, or in the range of about 2% to about 10%, or in the range of about 2% to about 8% or in the range of about 3% to about 6% on an atomic basis. In some embodiments, the carbon content of the nickel oxide film is greater than about 2%, 3%, 4% or 5%.

In some embodiments, the nickel oxide film has substantially no metallic nickel. As used in this regard, the term "substantially no metallic nickel" means that the nickel oxide film comprises less than about 5%, 4%, 3%, 2%, 1% or 0.5% $Ni^0$ on an atomic basis.

The temperature of the substrate during deposition can be controlled, for example, by setting the temperature of the substrate support or susceptor. In some embodiments the substrate is held or maintained at a temperature in the range of about 120° C. to about 450° C., or in the range of about 150° C. to about 425° C., or in the range of about 200° C. to about 425° C., or in the range of about 225° C. to about 400° C., or in the range of about 250° C. to about 350° C., or in the range of about 250° C. to about 300° C. In one or more embodiments, the second reactive gas comprises ozone or a mixture of ozone in oxygen and the temperature is in the range of about 120° C. to about 200° C.

Additional process parameters may be regulated while exposing the substrate to the nickel-containing process gas and/or the second reactive gas. For example, in some embodiments, the second reactive gas is flowed at a rate in the range of about 10 sccm to about 2000 sccm, or in the range of about 15 sccm to about 1500 sccm, or in the range of about 20 sccm to about 1000 sccm, or in the range of about 20 sccm to about 500 sccm. In some embodiments, the pulse time of the second reactive gas is in the range of about 0.5 seconds to about 5 seconds, or in the range of about 1 second to about 4 seconds. In some embodiments, the pulse time of the second reactive gas is controlled to form a nickel oxide film with a predetermined carbon content.

In some embodiments, the nickel film has a growth rate less than or equal to about 1.5 Å/cycle, where a cycle comprises a sequential exposure to the first reactive gas and the second reactive gas. In one or more embodiments, the growth rate of the nickel film is less than or equal to about 1.4 Å/cycle, 1.3 Å/cycle, 1.2 Å/cycle, 1.1 Å/cycle, 1.0 Å/cycle, 0.9 Å/cycle, 0.8 Å/cycle, 0.7 Å/cycle, 0.6 Å/cycle, 0.5 Å/cycle, 0.45 Å/cycle, 0.4 Å/cycle, 0.35 Å/cycle, 0.3 Å/cycle, 0.25 Å/cycle, 0.2 Å/cycle, 0.15 Å/cycle, 0.1 Å/cycle or 0.05 Å/cycle. In some embodiments, the nickel oxide film has a growth rate in the range of about 0.1 Å/cycle to about 1.5 Å/cycle.

EXAMPLES

Nickel oxide films were deposited on coupons in a temperature range of about 270° C. to about 350° C. with an O2 flow rate of 20 sccm to 500 sccm. The carbon content in the films was measured in the range of about 0% to about 10%. The film growth rate was adjusted to be in the range of about 0.1 Å/cycle to about 1.5 Å/cycle. Table 1 shows the carbon content of the film as a function of $O_2$ pulse time.

TABLE 1

| $O_2$ pulse time (sec) | Carbon Content (%) | |
|---|---|---|
| | 50 sccm | 100 sccm |
| 2 | — | 4.6 |
| 3 | — | 4.3 |
| 4 | 4.6 | — |
| 8 | 2.5 | 0.5 |
| 12 | 0.7 | — |

Table 2 shows the film growth rate as a function of $O_2$ pulse time on a silicon surface.

TABLE 2

| $O_2$ pulse time (sec) | Film Growth Rate (Å/pulse) | |
|---|---|---|
| | 50 sccm | 100 sccm |
| 1 | — | 0.05 |
| 2 | 0.09 | 0.33 |
| 3 | — | 0.44 |
| 4 | 0.27 | — |
| 8 | 0.52 | 0.68 |
| 12 | 0.69 | — |

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising exposing a substrate to a first reactive gas comprising a cyclopentadienyl nickel complex and a second reactive gas comprising a sub-saturative amount of a mixture of ozone and oxygen to form a nickel oxide film with a carbon content in the range of about 2 to about 10 atomic percent, the mixture of ozone and oxygen comprising in the range of 5% to 25% by weight ozone.

2. The processing method of claim 1, wherein the first reactive gas comprises bis(ethylcyclopentadienyl) nickel.

3. The processing method of claim 1, wherein the first reactive gas comprises an ethylcyclopentadienyl nickel carbonyl.

4. The processing method of claim 1, wherein the first reactive gas consists essentially of bis(ethylcyclopentadienyl)nickel.

5. The processing method of claim 1, wherein the first reactive gas comprises dicyclopentadienylnickel.

6. The processing method of claim 1, wherein the first reactive gas and the second reactive gas are exposed to the substrate at the same time in a mixture.

7. The processing method of claim 1, wherein the first reactive gas and the second reactive gas are exposed to the substrate sequentially.

8. The processing method of claim 1, wherein the second reactive gas further comprises water.

9. The processing method of claim 1, wherein the nickel oxide film has substantially no metallic nickel.

10. The processing method of claim 1, wherein the carbon content is substantially homogenous throughout the nickel oxide film.

11. The processing method of claim 1, wherein the substrate is maintained at a temperature in the range of about 180° C. to about 450° C.

12. The processing method of claim 11, wherein the substrate is maintained at a temperature in the range of about 225° C. to about 400° C.

13. The processing method of claim 1, wherein the second reactive gas is flowed at a rate in the range of about 10 sccm to about 2000 sccm.

14. The processing method of claim 1, wherein the first reactive gas and the second reactive gas are pulsed for a time in the range of about 0.5 seconds to about 5 seconds.

15. The method of claim 14, further comprising controlling the pulse time of oxygen to form a nickel oxide film with a predetermined carbon content.

16. The processing method of claim 1, wherein the nickel oxide film has a growth rate in the range of about 0.1 Å/cycle to about 1.5 Å/cycle, where a cycle comprises a sequential exposure to the first reactive gas and the second reactive gas.

17. A processing method comprising sequentially exposing a substrate to a pulse of a first reactive gas comprising bis(ethylcyclopentadienyl)nickel and a sub-saturative pulse of a second reactive gas consisting essentially a mixture of ozone and $O_2$ to form a nickel oxide film with a carbon content in the range of about 2 atomic percent to about 10 atomic percent, the mixture of ozone and oxygen comprising in the range of 5% to 25% by weight ozone.

18. The processing method of claim 17, further comprising repeating the pulses of the first reactive gas and the second reactive gas to form a nickel oxide film of a predetermined thickness.

* * * * *